United States Patent
Furuya et al.

(10) Patent No.: US 11,119,122 B2
(45) Date of Patent: Sep. 14, 2021

(54) POSITION CORRECTION METHOD, INSPECTION APPARATUS, AND PROBE CARD

(71) Applicant: TOKYO ELECTRON LIMITED, Tokyo (JP)

(72) Inventors: Kunihiro Furuya, Nirasaki (JP); Shingo Ishida, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 60 days.

(21) Appl. No.: 16/290,115

(22) Filed: Mar. 1, 2019

(65) Prior Publication Data
US 2019/0277884 A1    Sep. 12, 2019

(30) Foreign Application Priority Data
Mar. 9, 2018 (JP) ............... JP2018-043403

(51) Int. Cl.
*G01R 1/073* (2006.01)
*G01R 1/067* (2006.01)
(Continued)

(52) U.S. Cl.
CPC ....... *G01R 1/07342* (2013.01); *G01R 1/0675* (2013.01); *G01R 1/06727* (2013.01);
(Continued)

(58) Field of Classification Search
CPC ............ G01R 1/07385; G01R 1/07307; G01R 1/07342; G01R 1/06727; G01R 1/0675;
(Continued)

(56) References Cited

U.S. PATENT DOCUMENTS 6,255,126 B1 * 7/2001 Mathieu ............. G01R 1/06727
                                                   438/14
6,747,465 B2 * 6/2004 Esashi ................ G01R 1/07371
                                                   324/754.07
(Continued)

FOREIGN PATENT DOCUMENTS

JP          6318622 A      11/1994
KR   10-2008-0032110 A      1/2007
KR   10-2008-0032110 A      4/2008

OTHER PUBLICATIONS

Meng-Kai Shih, Design Optimization of Needle Geometry for Wafer-Level Probing Test, Jun. 2009, IEEE (Year: 2009).*

*Primary Examiner* — Huy Q Phan
*Assistant Examiner* — Dustin R Dickinson
(74) *Attorney, Agent, or Firm* — Nath, Goldberg & Meyer; Jerald L. Meyer; Tanya E. Harkins

(57) ABSTRACT

There is provided a method for correcting a relative position between a probe card having a plurality of cantilever-type probes and an object to be inspected having a plurality of electrode pads, including: arranging a first group of cantilever-type probes among the plurality of cantilever-type probes in a first region and a second region; arranging a second group of cantilever-type probes among the plurality of cantilever-type probes in a third region and a fourth region; obtaining needle traces formed on the plurality of electrode pads, which are generated when the first group of cantilever-type probes and the second group of cantilever-type probes that are arranged in the first region, the second region, the third region, and the fourth region, are brought into contact with the plurality of electrode pads; and correcting the relative position between the probe card and the object to be inspected based on the obtained needle traces.

6 Claims, 14 Drawing Sheets

(51) Int. Cl.
 *G01R 31/27* (2006.01)
 *G01R 31/28* (2006.01)
(52) U.S. Cl.
 CPC ....... *G01R 31/275* (2013.01); *G01R 31/2863* (2013.01); *G01R 31/2891* (2013.01)
(58) Field of Classification Search
 CPC ............ G01R 1/06733; G01R 1/06738; G01R 31/2891; G01R 31/2887; G01R 31/2863
 See application file for complete search history.

(56) References Cited

U.S. PATENT DOCUMENTS

| | | | |
|---|---|---|---|
| 2006/0208752 A1* | 9/2006 | Tanioka | G01R 1/07342 324/755.01 |
| 2006/0244438 A1 | 11/2006 | Toku et al. | |
| 2009/0184729 A1* | 7/2009 | Sano | G01R 31/2891 324/756.03 |
| 2010/0033201 A1* | 2/2010 | Hsu | G01R 1/06716 324/755.05 |
| 2011/0043235 A1* | 2/2011 | Kim | G01R 31/2891 324/755.11 |
| 2018/0003767 A1* | 1/2018 | Crippa | G01R 31/2891 |

\* cited by examiner

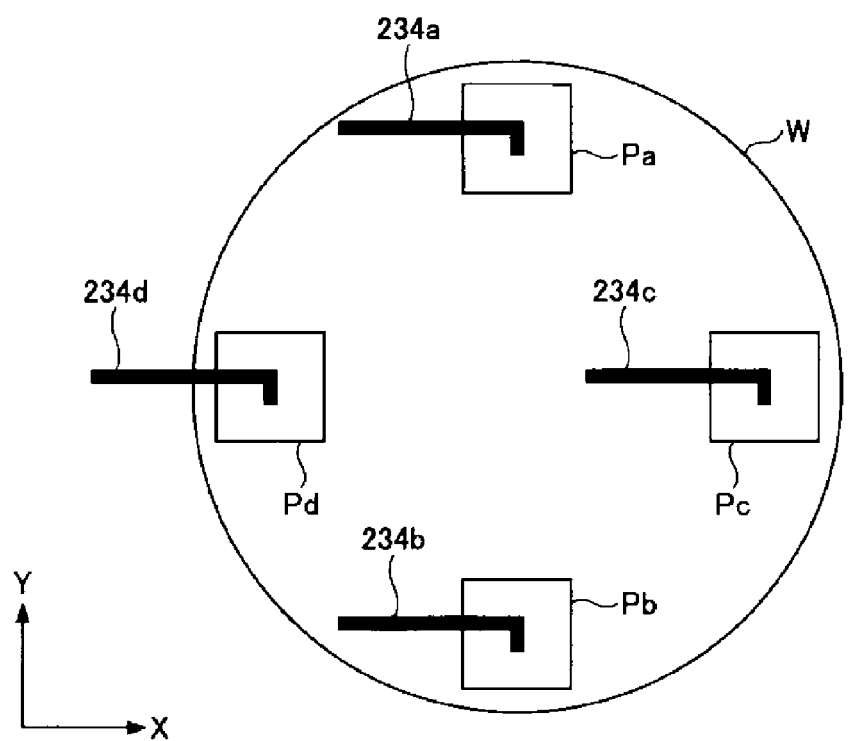

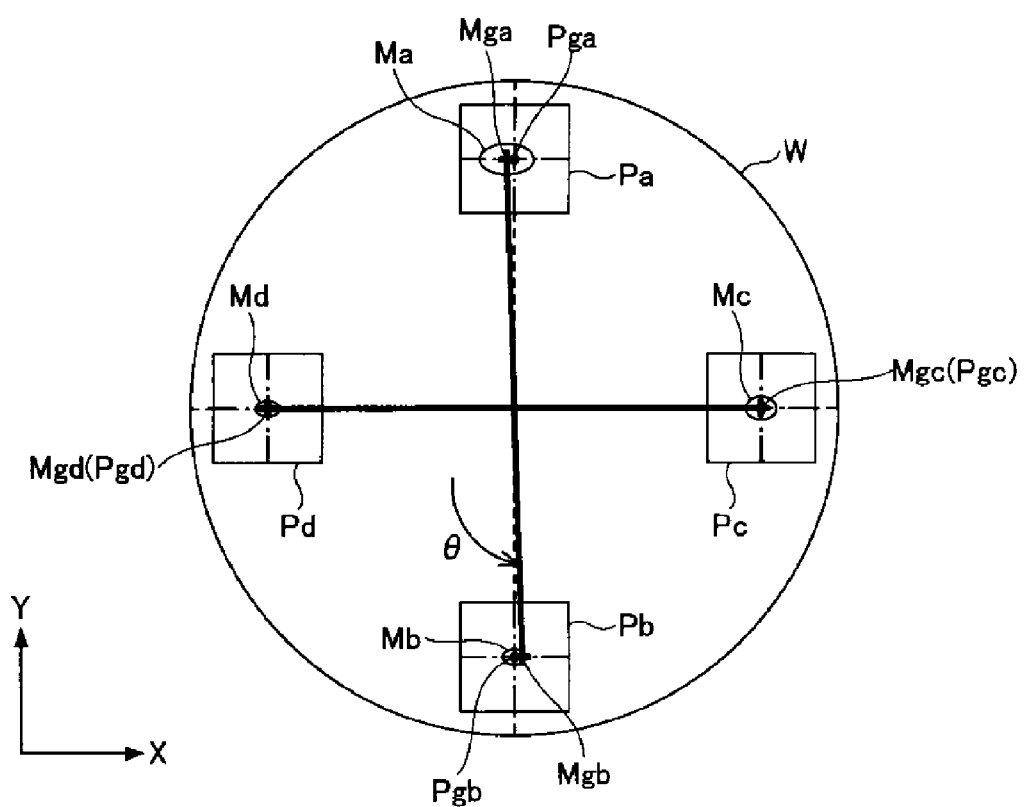

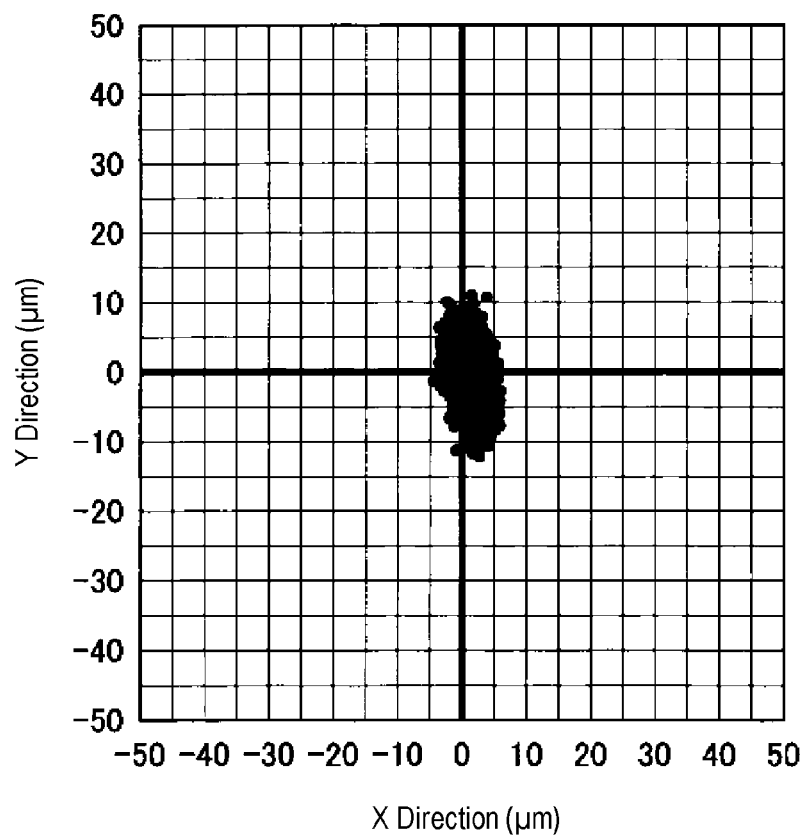

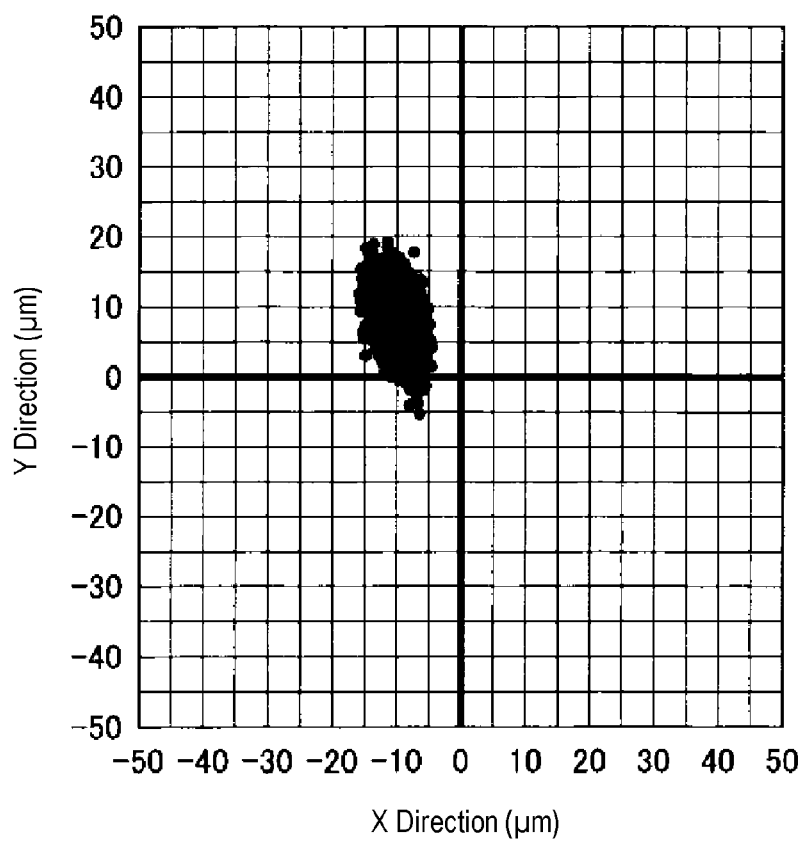

POSITION CORRECTION METHOD, INSPECTION APPARATUS, AND PROBE CARD

CROSS-REFERENCE TO RELATED APPLICATION

This application claims the benefit of Japanese Patent Application No. 2018-043403, filed on Mar. 9, 2018, in the Japan Patent Office, the disclosure of which is incorporated herein in its entirety by reference.

TECHNICAL FIELD

The present disclosure relates to a position correction method, an inspection apparatus, and a probe card.

BACKGROUND

In the related art, there is known an inspection apparatus for inspecting the electrical characteristics of an object to be inspected by bringing a probe into contact with an electrode pad of the object to be inspected. In such an inspection apparatus, it is important to accurately bring the probe provided in a probe card into contact with a target position of the electrode pad (for example, the center position of the electrode pad).

As a method of accurately bringing a probe into contact with a target position of an electrode pad, for example, there is known a method of transferring and positioning an object to be inspected to a contact position by checking a needle trace generated when bringing the probe into contact with the electrode pad using a monitor and specifying the position of the needle trace.

In a case in which a cantilever-type probe is used, when an object to be inspected is pressed against a probe card, the tip of the probe in contact with the electrode pad slides and moves in the longitudinal direction of the probe in a scrubbing manner. As a result, a needle trace is formed on an electrode pad. For this reason, needle traces having different shapes are formed on electrode pads depending on orientations of the probes provided in the probe card.

In the case where such needle traces having different shapes are formed as described above, a deviation may occur in the position of the needle traces when specifying the positions of the needle traces (e.g., gravity central positions) by checking the needle traces using a monitor. In particular, when operators check the needle traces using a monitor and specifies the positions of the needle traces, a difference may occur between the individual operators. When such a deviation occurs in the positions of the needle traces, it is difficult to correct the contact position at which the probes are brought into contact with the electrode pads with high accuracy.

SUMMARY

Some embodiments of the present disclosure provide a position correction method capable of correcting a contact position with high accuracy.

According to one embodiment of the present disclosure, there is provided a position correction method for correcting a relative position between a probe card having a plurality of cantilever-type probes and an object to be inspected having a plurality of electrode pads, the method including: arranging a first group of cantilever-type probes among the plurality of cantilever-type probes in a first region and a second region which face each other across a center of the probe card, respectively, wherein a longitudinal direction of the first group of cantilever-type probes corresponds to a first direction passing through the first region, the center of the probe card, and the second region; arranging a second group of cantilever-type probes among the plurality of cantilever-type probes in a third region and a fourth region which face each other across the center of the probe card in a second direction perpendicular to the first direction, respectively, wherein a longitudinal direction of the second group of cantilever-type probes corresponds to the second direction; obtaining needle traces formed on the plurality of electrode pads, which are generated when the first group of cantilever-type probes and the second group of cantilever-type probes that are arranged in the first region, the second region, the third region, and the fourth region, are brought into contact with the plurality of electrode pads; and correcting the relative position between the probe card and the object to be inspected based on the obtained needle traces.

According to another embodiment of the present disclosure, there is provided an inspection apparatus for inspecting an electrical characteristic of an object to be inspected by bringing a plurality of cantilever-type probes into contact with a plurality of electrode pads of the object to be inspected, the inspection apparatus including: a probe card on which the plurality of cantilever-type probes is arranged; and a controller configured to correct a relative position between the probe card and the object to be inspected, wherein a first group of cantilever-type probes among the plurality of cantilever-type probes is arranged in a first region and a second region which face each other across a center of the probe card, respectively, a longitudinal direction of the first group of cantilever-type probes corresponding to a first direction passing through the first region, the center of the probe card, and the second region, and a second group of cantilever-type probes among the plurality of cantilever-type probes is arranged in a third region and a fourth region which face each other across the center of the probe card in a second direction perpendicular to the first direction, respectively, a longitudinal direction of the second group of cantilever-type probes corresponding to the second direction; wherein the controller is configured to obtain needle traces formed on the plurality of electrode pads, which are generated when the first group of cantilever-type probes and the second group of cantilever-type probes that are arranged in the first region, the second region, the third region, and the fourth region, are brought into contact with the plurality of electrode pads; and to correct the relative position between the probe card and the object to be inspected based on the obtained needle traces.

According to yet another embodiment of the present disclosure, there is provided a probe card used in an inspection apparatus for inspecting an electrical characteristic of an object to be inspected by bringing a plurality of cantilever-type probes into contact with a plurality of electrode pads of the object to be inspected, the probe card including: the plurality of cantilever-type probes, wherein the plurality of cantilever-type probes includes: a first group of cantilever-type probes arranged in a first region and a second region which face each other across a center of the probe card, respectively, wherein a longitudinal direction of the first group of cantilever-type probes corresponds to a first direction passing through the first region, the center of the probe card, and the second region; and a second group of cantilever-type probes arranged in a third region and a fourth region which face each other across the center of the probe card in a second direction perpendicular to the first direction, respectively, wherein a longitudinal direction of the second group of cantilever-type probes corresponds to the second direction.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A and 6B are views for explaining another example in which a deviation occurs in a θ direction due to a difference in probe height.

FIGS. 9A and 9B are views each showing a deviation amount of a gravity central position of a needle trace relative to a center position of an electrode pad.

DETAILED DESCRIPTION

Figure 1:
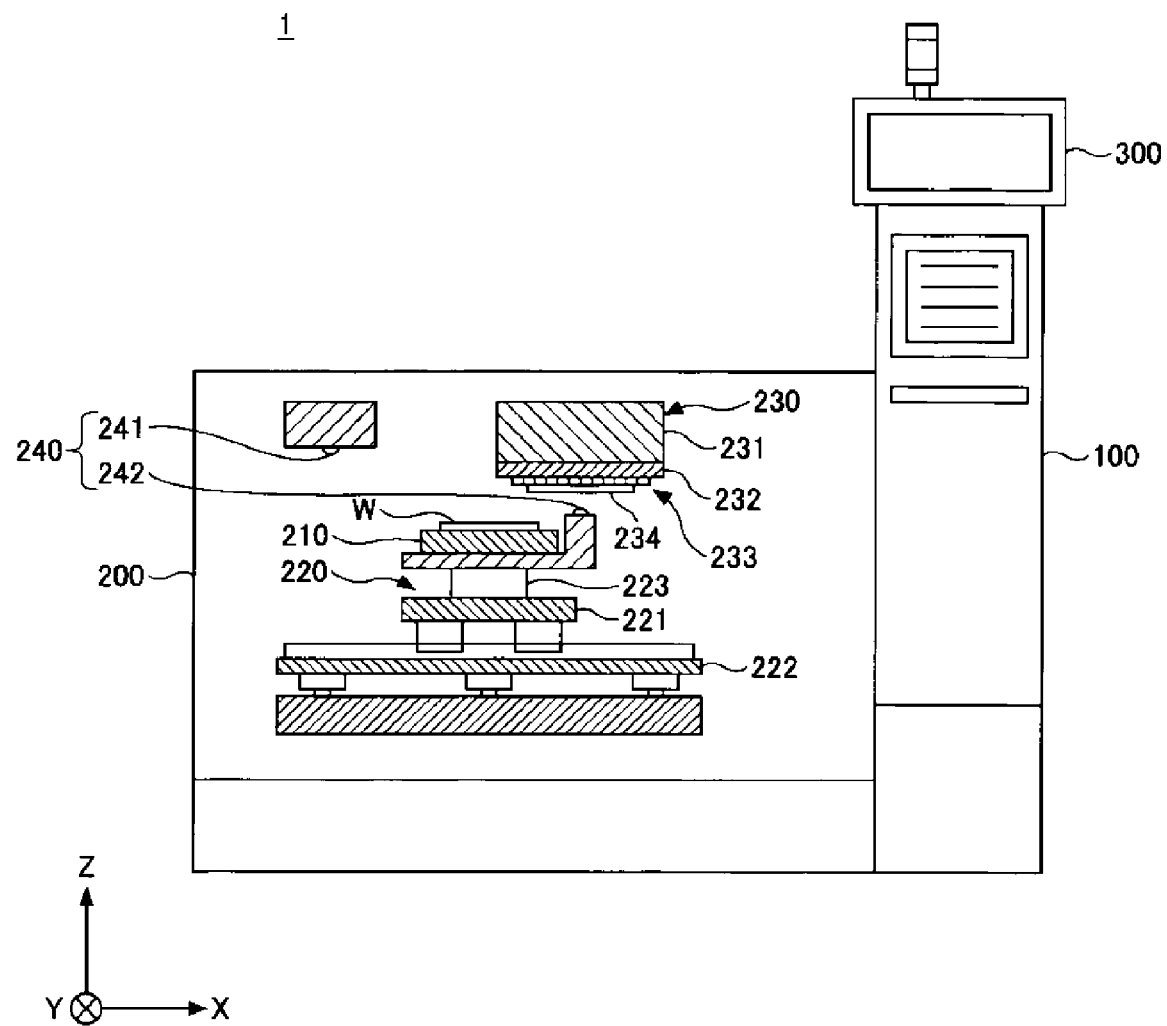
FIG. 1 is a schematic view showing an example of an inspection apparatus according to an embodiment.

Hereinafter, embodiments for carrying out the present disclosure will be described with reference to drawings. In the subject specification and the drawings, components having substantially identical functions and configurations will be designated by like reference numerals with the duplicate descriptions thereof omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments

[Inspection Apparatus]

An example of an inspection apparatus according to an embodiment will be described. FIG. 1 is a schematic view showing an example of an inspection apparatus according to an embodiment.

An inspection apparatus 1 is used to inspect electrical characteristics of a plurality of semiconductor devices by bringing probes 234 into contact with electrode pads of the semiconductor devices formed on a semiconductor wafer (hereinafter simply referred to as a "wafer W"). The inspection apparatus 1 includes a transfer chamber 100, an inspection room 200, and a control device 300.

In the transfer chamber 100, a wafer W loaded from outside the apparatus is transferred into the inspection room 200 by a transfer arm (not shown) or the like. The wafer W may be, for example, a product wafer or a dummy wafer. The product wafer is a wafer having a plurality of semiconductor devices formed thereon. Each semiconductor device is provided with electrode pads made of metal. Each electrode pad is connected to an integrated circuit formed inside each semiconductor device. The dummy wafer is a wafer having a plurality of electrode pads for position correction formed on the surface of the wafer. Each electrode pad is formed of metal and is provided so as to correspond to a position of each of a plurality of probes provided in a jig probe card (to be described later).

The inspection room 200 is provided adjacent to the transfer chamber 100. Inside the inspection room 200, the electrical characteristics of the semiconductor devices formed on the wafer W are inspected. The inspection room 200 includes a mounting table 210, a stage 220, an inspection unit 230, and an imaging unit 240.

The mounting table 210 receives the wafer W loaded into the inspection room 200 from the transfer chamber 100 and adsorptively holds the wafer W on an upper surface of the mounting table 210.

The stage 220 is configured to move the mounting table 210 in an X direction, a Y direction, a Z direction, and a θ direction. The stage 220 includes an X stage 221, a Y stage 222, a lifting/rotating part 223, and an electric motor (not shown). The X stage 221, the Y stage 222, and the lifting/rotating part 223 are moved or rotated by the power of the electric motor.

The inspection unit 230 is disposed in a ceiling portion of the inspection room 200. The inspection unit 230 includes a head plate 231, a pogo frame 232 constituting a lower surface of the head plate 231, and a probe card 233 supported on a lower surface of the pogo frame 232. The plurality of cantilever-type probes 234 is provided on a lower surface of the probe card 233. The probe card 233 is connected to a tester (not shown). In the state in which each probe 234 is brought into contact with each electrode pad, voltage and current are applied from the tester to each electrode pad via each probe 234 under various conditions. An output value obtained from each electrode pad is measured, thereby inspecting the electrical characteristics of each semiconductor device.

The imaging unit 240 includes an upper camera 241 configured to move in the ceiling portion of the inspection room 200, and a lower camera 242 configured to be fixed to the mounting table 210. For example, the upper camera 241 and the lower camera 242 may be CCD cameras. In addition, the upper camera 241 and the lower camera 242 may be cameras incorporating therein other image elements such as CMOS sensors.

The control device 300 is provided on the transfer chamber 100. The control device 300 controls operations of various devices provided inside the transfer chamber 100 and the inspection room 200 (for example, the transfer arm, the mounting table 210, the stage 220, the inspection unit 230, and the imaging unit 240). With this configuration, the inspection of the electrical characteristics of semiconductor devices is carried out.

In order to inspect the electrical characteristics of semiconductor devices using the inspection apparatus 1 configured as above, the stage 220 is first moved in the X-Y plane such that the semiconductor devices to be inspected are positioned directly under respective probes 234 of the probe card 233. Subsequently, the stage 220 is moved upward (moved in the Z direction) to bring the probes 234 into contact with respective electrode pads. Subsequently, in the state in which the probes 234 are in contact with the respective electrode pads, voltage and current are applied to the respective electrode pads from the tester through the respective probes 234 under various conditions. Output values obtained from the electrode pads are measured, thereby inspecting the electrical characteristics of the semiconductor devices. Upon completion of the inspection, the stage 220 is moved downward (moved in the −Z direction) to separate the probes 234 from the respective electrode pads.

When imaging the electrode pads of the semiconductor device by the imaging unit 240, the stage 220 is moved in the X-Y plane such that the upper camera 241 is positioned directly above an electrode pad to be imaged in order to pick up an image of the respective electrode pad. Alternatively, the upper camera 241 may be moved in the X-Y plane to be positioned directly above the electrode pad to be imaged so as to pick up an image of the respective electrode pad.

[Probe Card]

Configuration examples of the probes 234 provided in the probe card 233 of the inspection apparatus 1 according to the present embodiment will be described. As an example, the probe card 233 may be a jig probe card, which is provided with a plurality of probes for position correction on the surface of the jig probe card. Correction results obtained by the position correction using the jig probe card are used as offset values when, for example, an inspection probe card used for product inspection is used. The probe card may be the inspection probe card.

FIRST CONFIGURATION EXAMPLE

Figure 2:
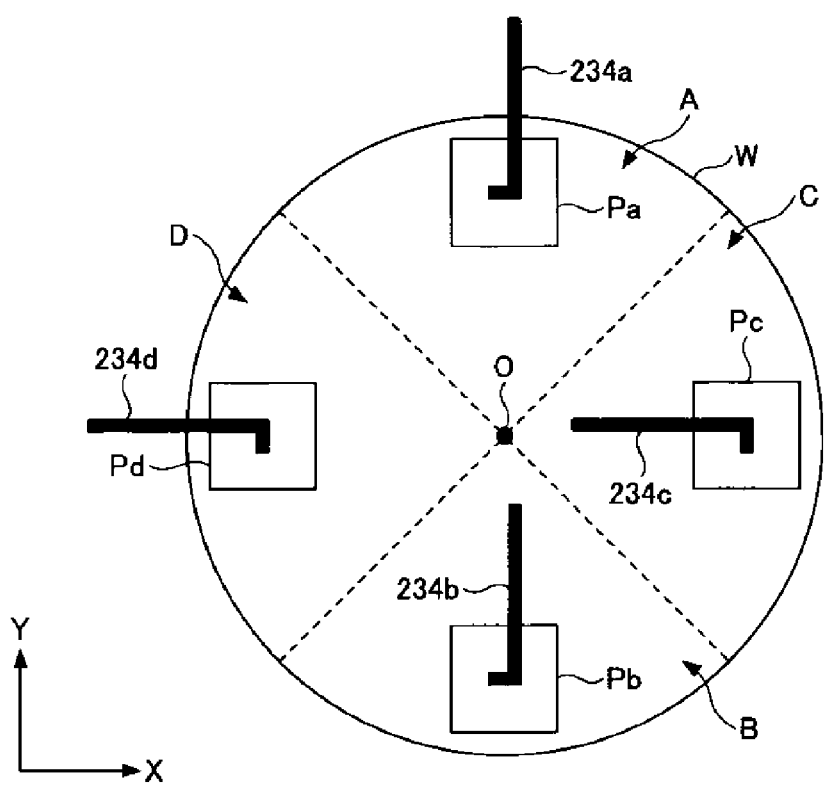
FIG. 2 is a view illustrating the arrangement of probes according to a first configuration example.

FIG. 2 is a view showing the arrangement of probes 234 according to a first configuration example. FIG. 2 illustrates the state in which the center of the probe card 233 coincides with the center O of the wafer W. For the sake of convenience in description, an illustration of the probe card 233 is omitted. Further, the electrode pads and the probes are drawn on a larger scale relative to the size of the wafer W. In FIG. 2, boundary lines between respective regions are indicated by broken lines.

In the first configuration example, cantilever-type probes 234a, 234b, 234c, and 234d are arranged at positions corresponding to electrode pads Pa, Pb, Pc, and Pd respectively formed in four regions A, B, C, and D which are obtained by dividing the wafer W in the circumferential direction. The four regions A, B, C, and D may be evenly divided or unevenly divided. The region A and the region B face each other across the center O of the wafer W, and the region C and the region D face each other across the center O of the wafer W. In this configuration example, the regions A, B, C, and D have straight lines, which extend from the center O in the twelve o'clock direction (+Y direction), six o'clock direction (−Y direction), three o'clock direction (+X direction), and nine o'clock direction (−X direction), respectively.

The probes 234a and 234b used as a first group of probes are disposed at positions that correspond to the electrode pads Pa and Pb respectively formed in the regions A and B such that the longitudinal directions thereof are in a first direction passing through the region A, the center O, and the region B. In this configuration example, the probes 234a and 234b are disposed at positions that correspond to the electrode pads Pa and Pb respectively formed in the regions A and B such that the longitudinal directions thereof are in the twelve o'clock direction and the six o'clock direction, respectively. In addition, the probes 234a and 234b are arranged such that scrubbing directions thereof are identical to each other (−Y direction). The scrubbing direction means a direction from the start position of the scrubbing to the end position of the scrubbing when a probe is brought into contact with a respective electrode pad.

The probes 234c and 234d used as a second group of probes are disposed at positions that correspond to the electrode pads Pc and Pd formed in the regions C and D such that the longitudinal directions thereof are in a second direction passing through the region C, the center O, and the region D. The second direction may be a direction perpendicular to the first direction. In this configuration example, the probes 234c and 234d are disposed at positions that correspond to the electrode pads Pc and Pd respectively formed in the regions C and D such that the longitudinal directions thereof are in the three o'clock direction and the nine o'clock direction, respectively. In addition, the probes 234c and 234d are arranged such that the scrubbing directions thereof are the same direction (+X direction).

SECOND CONFIGURATION EXAMPLE

Figure 3:
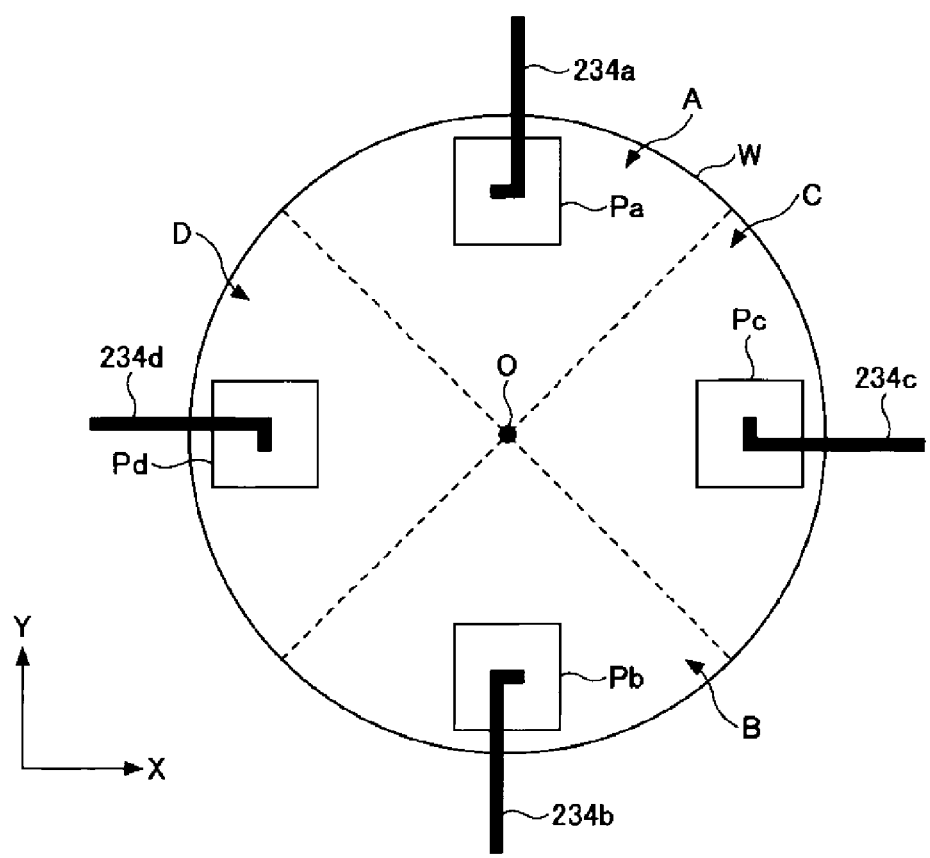
FIG. 3 is a view illustrating the arrangement of probes according to a second configuration example.

FIG. 3 is a view showing the arrangement of probes 234 according to a second configuration example. FIG. 3 illustrates the state in which the center of the wafer W and the center of the probe card 233 coincide with each other. For the sake of convenience in description, an illustration of the probe card 233 is omitted. Further, the electrode pads and the probes are drawn on a large scale relative to the size of the wafer W. In FIG. 3, boundary lines between respective regions are indicated by broken lines.

In the second configuration example, the probes 234a and 234b are arranged such that the scrubbing directions thereof are headed in different directions, and the probes 234c and 234d are arranged such that the scrubbing directions thereof are headed in different directions. In this configuration example, the probe 234a is arranged such that the scrubbing direction thereof is the −Y direction, and the probe 234b is arranged such that the scrubbing direction thereof is the +Y direction. Further, the probe 234c is arranged such that the scrubbing direction thereof is the −X direction, and the probe 234d is arranged such that the scrubbing direction thereof is the +X direction. The other components may be the same as those in the first configuration example.

THIRD CONFIGURATION EXAMPLE

Figure 4:
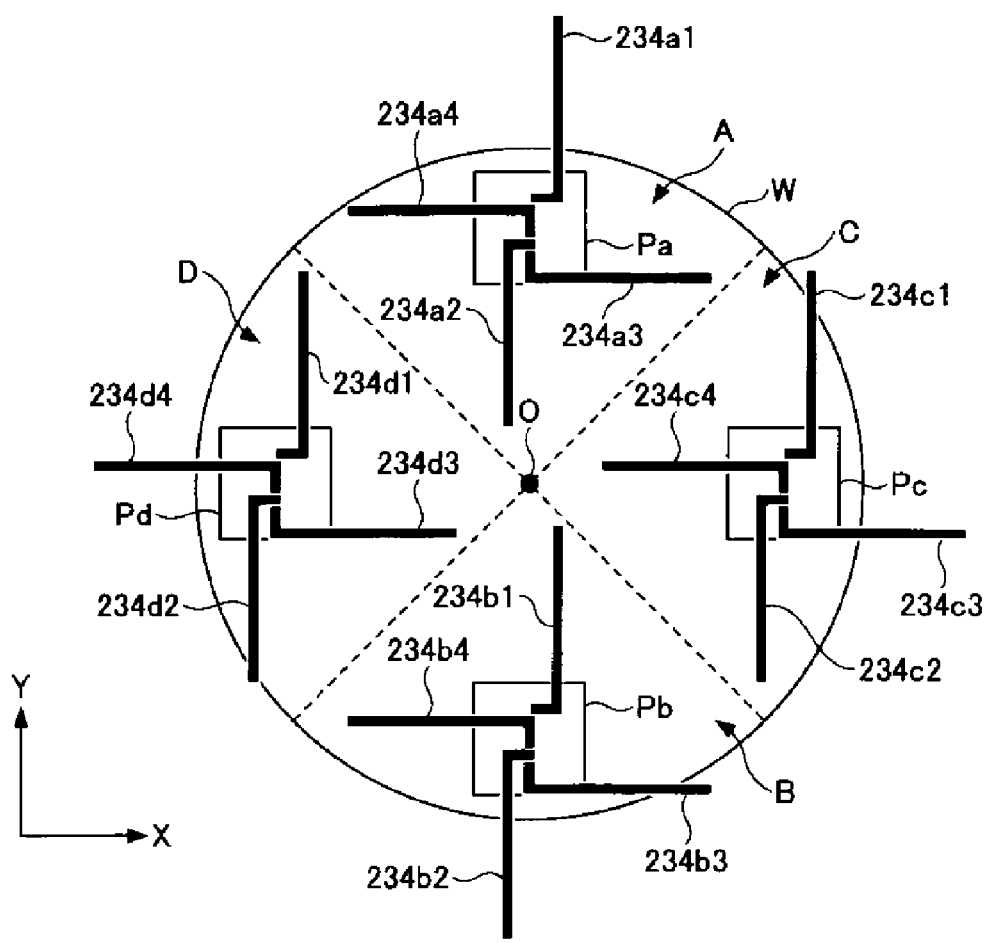
FIG. 4 is a view illustrating the arrangement of probes according to a third configuration example.

FIG. 4 is a view showing the arrangement of probes 234 according to a third configuration example. FIG. 4 illustrates the state in which the center of the wafer W and the center of the probe card 233 coincide with each other. For the sake of convenience in description, an illustration of the probe card 233 is omitted. Further, the electrode pads and the probes are drawn on a large scale relative to the size of the wafer W. In FIG. 4, boundary lines between respective regions are indicated by broken lines.

In the third configuration example, four cantilever-type probes are arranged at each of the positions corresponding to electrode pads Pa, Pb, Pc, and Pd respectively formed in four regions A, B, C, and D obtained by dividing the wafer W in the circumferential direction.

Probes 234a1, 234a2, 234a3, and 234a4 are arranged in the region A. The probes 234a1, 234a2, 234a3, and 234a4 are arranged such that scrubbing directions thereof are different from each other. In this configuration example, the probes 234a1 and 234a2 are arranged such that the scrubbing directions thereof are headed in different directions, and the probes 234a3 and 234a4 are arranged such that the scrubbing directions thereof are headed in different directions. However, the probes 234a1 and 234a2 may be arranged such that the scrubbing directions thereof are the same, and the probes 234a3 and 234a4 may be arranged such that the scrubbing directions thereof are the same.

Probes 234b1, 234b2, 234b3, and 234b4 are arranged in the region B. The probes 234b1, 234b2, 234b3, and 234b4 are arranged such that scrubbing directions thereof are different from each other. In this configuration example, the probes 234b1 and 234b2 are arranged such that the scrubbing directions thereof are headed in different directions, and the probes 234b3 and 234b4 are arranged such that the scrubbing directions thereof are headed in different directions. However, the probes 234b1 and 234b2 may be arranged such that the scrubbing directions thereof are the same, and the probes 234b3 and 234b4 are arranged such that the scrubbing directions thereof are the same.

Probes 234c1, 234c2, 234c3, and 234c4 are arranged in the region C. The probes 234c1, 234c2, 234c3, and 234c4 are arranged such that scrubbing directions thereof are different from each other. In this configuration example, the probes 234c1 and 234c2 are arranged such that the scrubbing directions thereof are headed in different directions, and the probes 234c3 and 234c4 are arranged such that the scrubbing directions thereof are headed in different directions. However, the probes 234c1 and 234c2 may be arranged such that the scrubbing directions thereof are the same, and the probes 234c3 and 234c4 may be arranged such that the scrubbing directions thereof are the same.

Probes 234d1, 234d2, 234d3, and 234d4 are arranged in the region D. The probes 234d1, 234d2, 234d3, and 234d4 are arranged such that scrubbing directions thereof are different from each other. In this configuration example, the probes 234d1 and 234d2 are arranged such that the scrubbing directions thereof are headed in different directions, and the probes 234d3 and 234d4 are arranged such that the scrubbing directions thereof are headed in different directions. However, the probes 234d1 and 234d2 may be arranged such that the scrubbing directions thereof are the same, and the probes 234d3 and 234d4 may be arranged such that the scrubbing directions thereof are the same.

In the above-described configuration examples, the case where the wafer W is divided into four regions in the circumferential direction has been described. However, the present description is not limited thereto, and the wafer W may be divided into five or more regions. In this case, a relative position between the probe card and the wafer W may be corrected on the basis of needle traces formed on an electrode pad, which are obtained when the probes disposed in each of the five or more regions are brought into contact with the respective electrode pad.

[Position Correction Method]

In the inspection apparatus 1 according to the present embodiment, a method of correcting the relative position between the probe card 233 having the cantilever-type probes 234 and the wafer W having the electrode pads P (hereinafter, referred to as a "position correction method") will be described. The position correction method according to the present embodiment is carried out using a jig probe card, for example, before a product wafer is accommodated in the inspection room 200 and the electrical characteristics of semiconductor devices formed on the product wafer are inspected. In addition, correction results calculated by the position correction method performed using the jig probe card are used as offset values when an inspection probe card for product inspection is used.

First, a jig probe card is installed as the probe card 233 of the inspection unit 230. The jig probe card may be, for example, the probe card having the probes 234 illustrated in the first to third configuration examples.

Subsequently, the wafer W as a dummy wafer which is provided with a plurality of electrode pads for position correction on the surface thereof, is mounted on the mounting table 210 in the inspection room 200 and is moved to a contact position. Subsequently, the lifting/rotating part 223 of the stage 220 is extended to move the mounting table 210 upward, so that the electrode pad of the dummy wafer mounted on the mounting table 210 is brought into contact with the respective probe of the jig probe card. Thus, a needle trace is formed on a respective electrode.

Subsequently, an electrode pad to be imaged is moved below the upper camera 241 to pick up an image of the needle trace formed on the electrode pad. The image including the needle trace picked up by the upper camera 241 is transmitted to the control device 300. Such a process is performed for each of the plurality of electrode pads. In some embodiments, the upper camera 241 may be moved above the dummy wafer without moving the dummy wafer so as to pick up the image of the needle trace formed on the electrode pad.

Subsequently, the control device 300 calculates a gravity central position of the needle traces by analyzing the image including the needle trace picked up by the upper camera 241. A well-known method may be used for calculating the gravity central position by the image analysis. For example, a region occupied by the needle trace included in the image or pixels constituting a boundary of the region are detected on the basis of the luminance of the pixels, and the gravity central position of the needle trace is calculated on the basis of coordinates of the pixels. Subsequently, the control device 300 compares a predetermined target position (e.g., the center position of the electrode pad) with the gravity central position of the needle trace, and calculates a deviation amount between the predetermined target position and the gravity central position of the needle trace. In addition, the control device 300 performs this process for each of the plurality of electrode pads.

Subsequently, the control device 300 calculates a correction amount as a whole of the probe card, on the basis of the calculated deviation amounts obtained for the respective electrode pad. More specifically, for example, the control device 300 calculates the correction amount of the entire probe card such that each of different deviation amounts of the respective electrode pads is set as close to zero as possible, namely such that the gravity central position of each needle trace and each target position are set as close to one another as possible. A well-known method may be used to calculate the correction amount. For example, a least-squares method may be used. Further, the calculated correction amount is stored in a storage part of the control device 300, for example.

Subsequently, the jig probe card is replaced with an inspection probe card, which is used for product inspection, and a product wafer is mounted on the mounting table 210 instead of the dummy wafer. Using the calculated correction amount as an offset value, the control device 300 corrects a contact position at which the product wafer mounted on the mounting table 210 is inspected.

Subsequently, the control device 300 moves the product wafer to the corrected contact position. Subsequently, the lifting/rotating part 223 of the stage 220 is extended to move the mounting table 210 upward, so that the electrode pads of the product wafer mounted on the mounting table 210 is brought into contact with the probes of the inspection probe card. Thereafter, the electrical characteristics of the semiconductor devices formed on the product wafer are inspected while the electrode pads of the product wafer and the probes of the inspection probe card are in contact with each other.

When the respective electrode pads and the respective probes are brought into contact with each other using the cantilever-type probes, the positions and sizes of the needle traces formed on the electrode pads differ from each other depending on differences in height of the tips of the probes. Such differences in height of the tips of the probes occur, for example, due to errors in the design of the probe card and a progression degree of time-dependent deterioration in each probe.

Figure 7A:
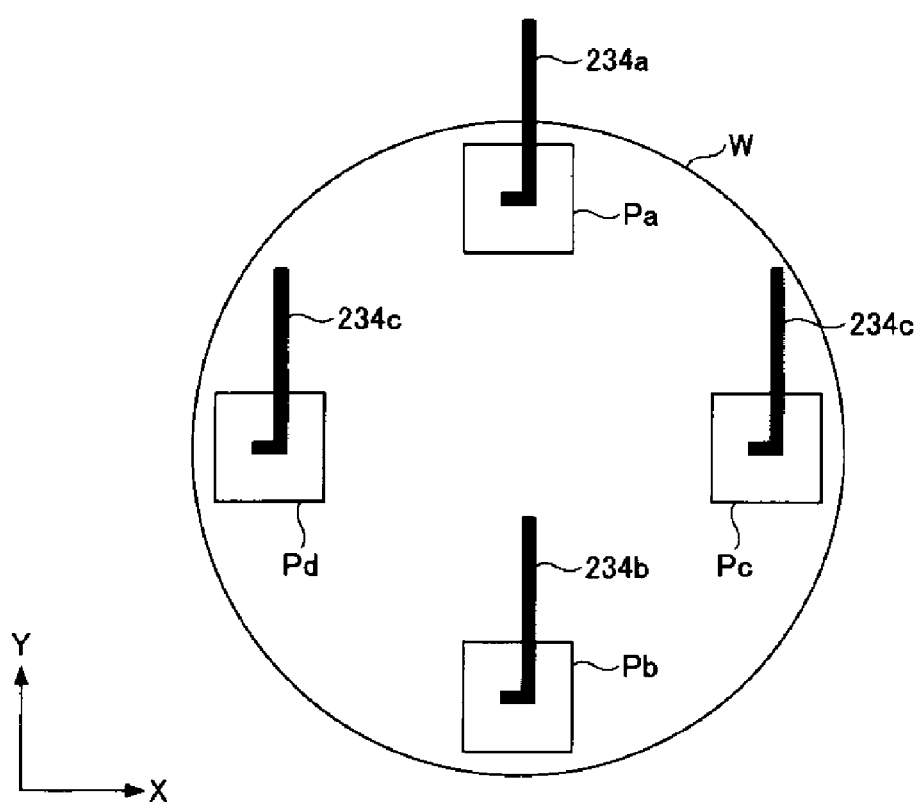
FIGS. 7A and 7B are views for explaining another example in which a deviation occurs in a θ direction due to a difference in probe height.
Figure 7B:
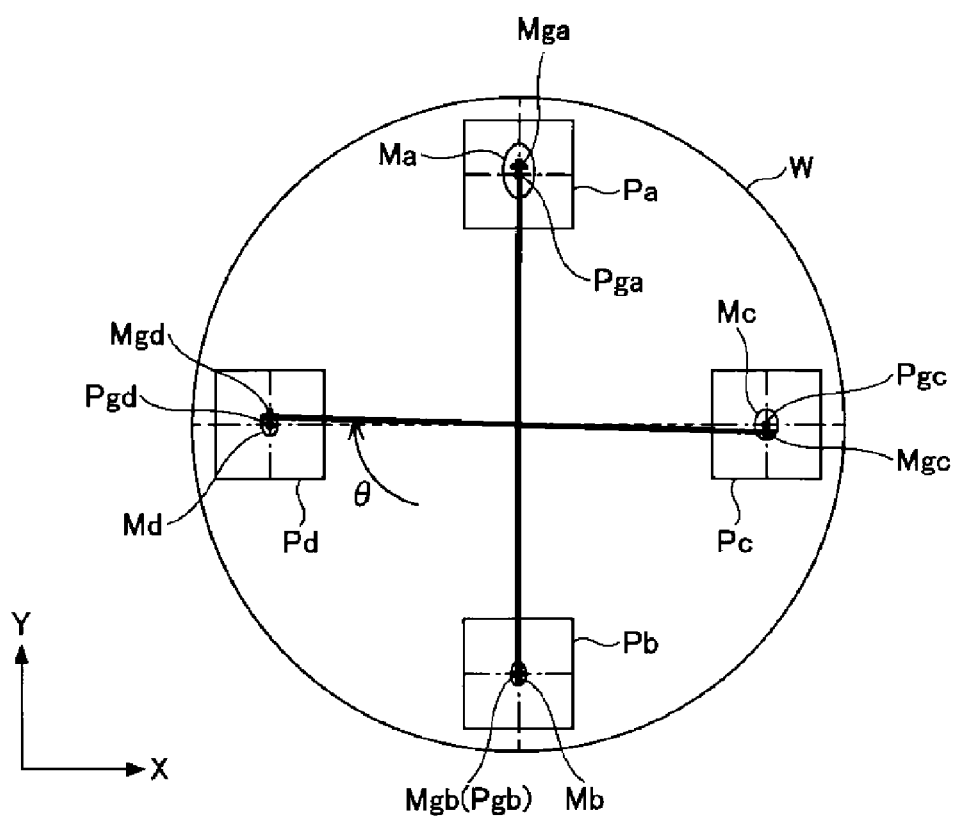
Figure 8A:
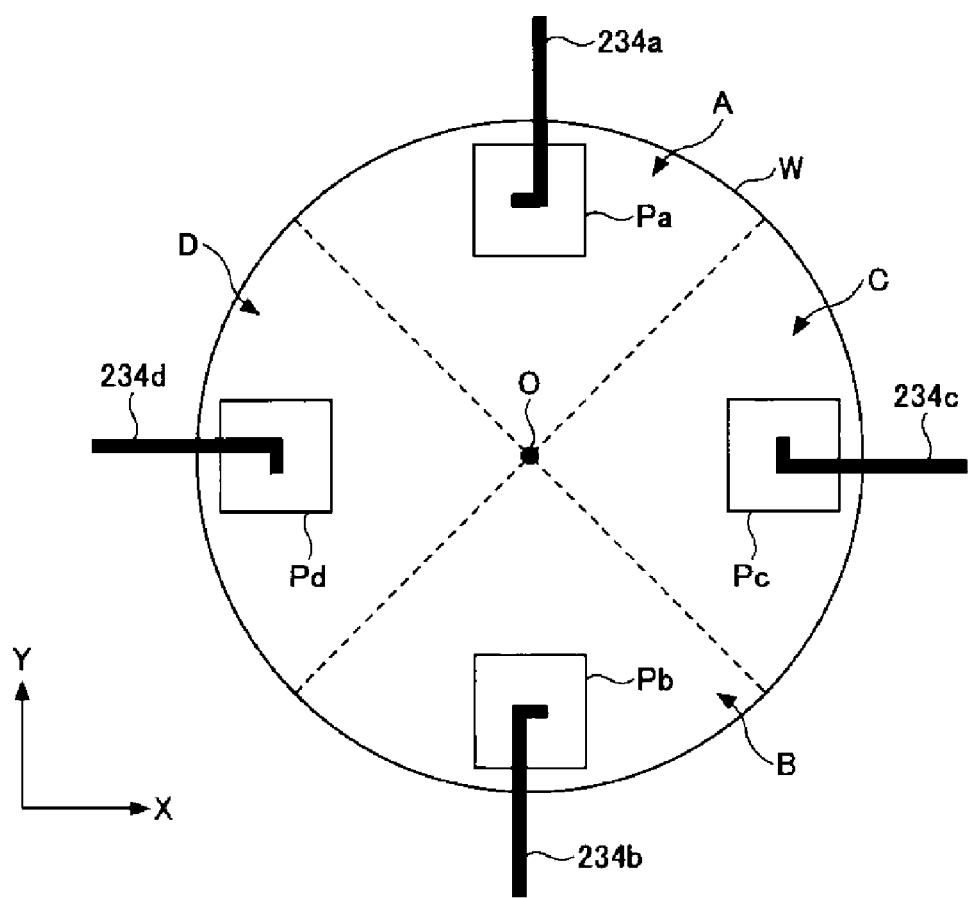
FIGS. 8A and 8B are views for explaining another example a configuration in which no deviation occurs in a θ direction even with a difference in probe height.
Figure 8B:
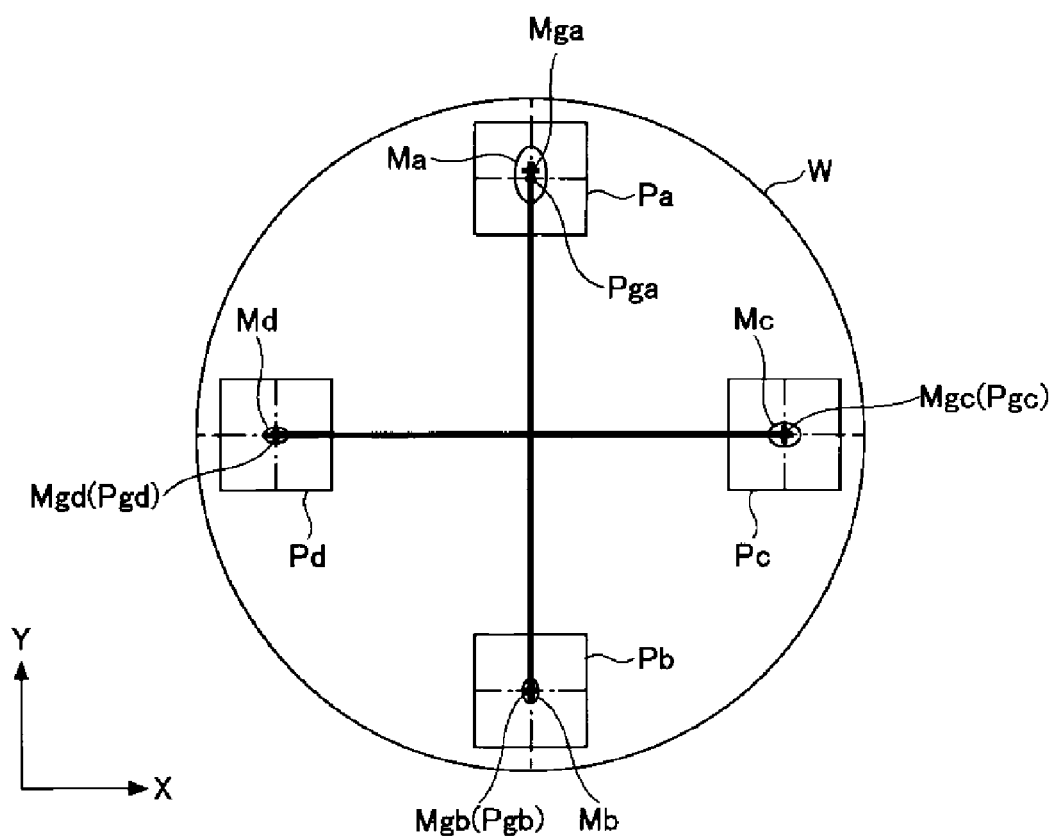

FIGS. 5A to 7B are views for explaining an example in which a deviation occurs in a θ direction due to a difference in probe height. FIGS. 8A and 8B are views for explaining another example in which no deviation occurs in the θ direction even with a difference in probe height. Each of FIG. 6A, FIG. 7A, and FIG. 8A shows a positional relationship between electrode pads P formed on the wafer W and probes 234 provided on the probe card, and each of FIG. 6B, FIG. 7B, and FIG. 8B shows positions of needle traces M formed on the electrode pads P.

Figure 5A:
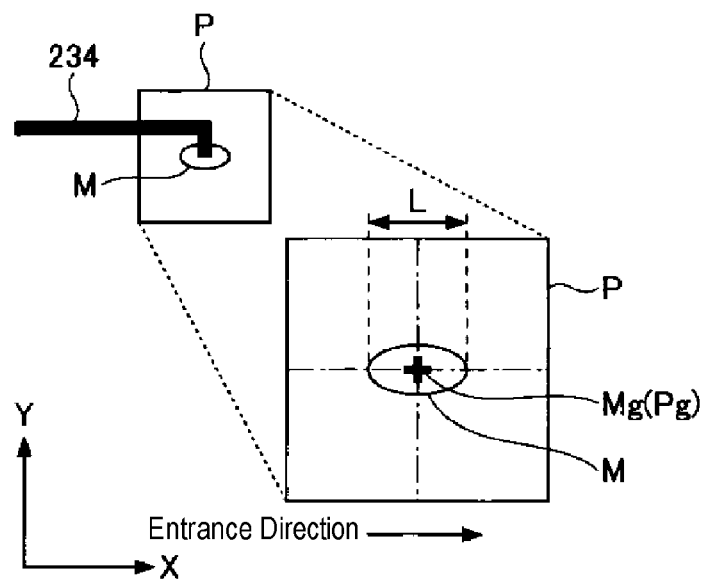
FIGS. 5A to 5D are views for explaining an example in which a deviation occurs in a θ direction due to a difference in probe height.

It is assumed that when a probe 234 whose longitudinal direction corresponds to the X direction is used in the case in which there is no design error of the probe card and time-dependent deterioration of the probes, a gravity center position Mg of the needle trace M coincides with a center position Pg of the electrode pad P, and a needle trace M having a predetermined length L in the longitudinal direction is formed (see FIG. 5A).

Figure 5B:
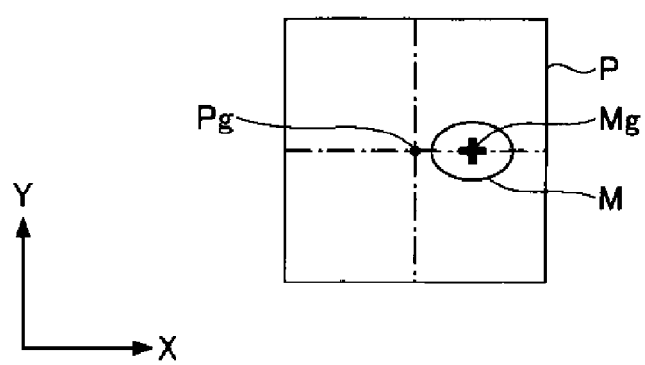
Figure 5C:
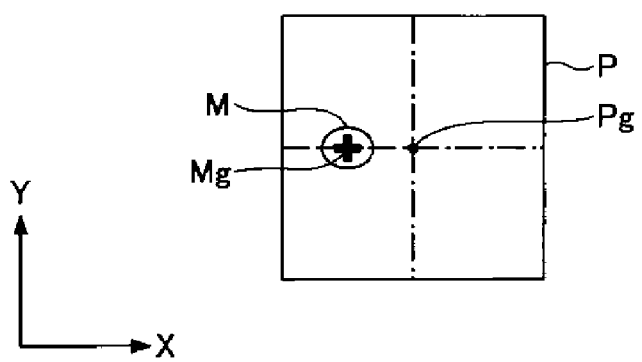
Figure 5D:
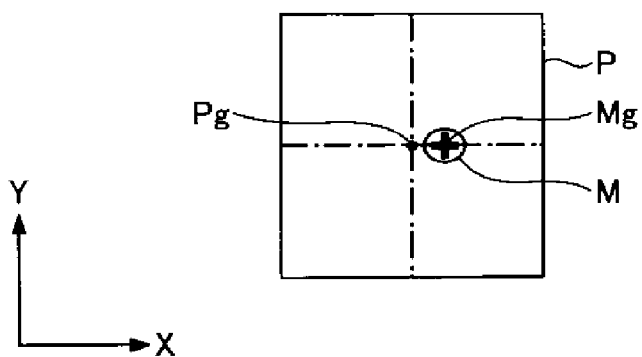

In this case, when the height of the tip of the probe is varied due to the design error of the probe and the time-dependent deterioration of the probe, the gravity central position Mg of the needle trace M may be deviated in the +X direction or the −X direction with respect to the center position Pg of the electrode pad P, as shown in FIGS. 5B to 5D. Further, as shown in FIGS. 5B to 5D, for example, a difference may occur in the length of the needle trace M in the longitudinal direction.

At this time, for example, as shown in FIG. 6A, a case is considered in which a correction amount of the entire probe card is calculated using a probe card having four probes 234a, 234b, 234c, and 234d arranged such that the longitudinal directions thereof are the same (i.e., the X direction). In this case, almost no deviation occurs between Y coordinates of gravity central positions Mgc and Mgd of the needle traces Mc and Md of the probes 234c and 234d, and Y coordinates of center positions Pgc and Pgd of respective electrode pads Pc and Pd. Therefore, it is possible to correct a deviation amount in the Y direction with high accuracy. Meanwhile, there is a large deviation amount between X coordinates of gravity central positions Mga and Mgb of the needle traces Ma and Mb of the probes 234a and 234b, and X coordinates of center positions Pga and Pgb of respectively electrode pads Pa and Pb. Therefore, it is impossible to correct a deviation amount in the X direction with high accuracy. As a result, it is impossible to accurately correct a deviation amount in the θ direction between the probe card and the wafer W.

In addition, for example, as shown in FIG. 7A, a case is considered in which a correction amount of the entire probe card is calculated using a probe card having four probes 234a, 234b, 234c, and 234d arranged such that the longitudinal directions thereof are the same (i.e., the Y direction). In this case, almost no deviation occurs between X coordinates of gravity central positions Mga and Mgb of the needle traces Ma and Mb of the probes 234a and 234b, and X coordinates of center positions Pga and Pgb of the electrode pads Pa and Pb. Therefore, it is possible to correct a deviation amount in the X direction with high accuracy. Meanwhile, there is a large deviation amount between Y coordinates of gravity central positions Mgc and Mgd of the needle traces Mc and Md of the probes 234c and 234d, and Y coordinates of center positions Pgc and Pgd of the electrode pads Pc and Pd. Therefore, it is impossible to correct a deviation amount in the Y direction with high accuracy. As a result, it is impossible to accurately correct a deviation amount in the θ direction between the probe card and the wafer W.

In contrast, as shown in FIG. 8A, in the probe card according to the present embodiment, probes 234a and 234b whose longitudinal directions are defined as the first direction (the Y direction) passing through the region A, the center O, and the region B are respectively arranged in the regions A and B which face each other across the center O of the wafer W. In addition, in the regions C and D which face each other across the center of the center O in a second direction (the X direction) perpendicular to the first direction, probes 234c and 234d whose longitudinal directions are defined as the second direction are arranged, respectively. Four probes having different penetration directions are used. In this case, there is a small deviation amount between the X coordinates of the gravity central positions Mga and Mgb of the needle traces Ma and Mb of the probes 234a and 234b, and the X coordinates of the center positions Pga and Pgb of the electrode pads Pa and Pb. Therefore, it is possible to correct a deviation amount in the X direction with high accuracy. In addition, almost no deviation occurs between the Y coordinates of the gravity central positions Mgc and Mgd of the needle traces Mc and Md of the probes 234c and 234d, and the Y coordinates of the center positions Pgc and Pgd of the electrode pads Pc and Pd. Therefore, it is possible to correct a deviation amount in the Y direction with high accuracy on the basis of the needle traces Mc and Md of the probes 234c and 234d. As a result, since it is possible to accurately correct a deviation amount in the θ direction between the probe card and the wafer W, it is possible to correct the contact position with high accuracy. It is possible to obtain the same effect even when the penetration directions of the probes 234a and 234b are the same and the penetration directions of the probe 234c and the probe 234d are the same.

As described above, the position correction method according to the present embodiment corrects the relative position between the probe card 233 and the wafer W based on the needle traces Ma to Md generated when the probes 234a to 234d disposed in the regions A to D are brought into contact with the respective electrode pads Pa to Pd. As a result, even if a difference occurs in the heights of the probes 234 due to the design error of the probe card 233 or the progression of the time-dependent deterioration of each probe 234, it is possible to accurately calculate the deviation amount between the probe card 233 and the wafer W. Therefore, it is possible to correct the positions at which the probes 234 are brought into contact with the electrode pads P with high accuracy.

The position correction method according to the present embodiment corrects the positions at which the probes 234 are brought into contact with the electrode pads P using the probe card 233 having the cantilever-type probes 234. Thus, the position correction method is applicable even when a dimension of the inspection room 200 in the height direction is short, thereby having an advantage over a probe card having vertical probes.

EXAMPLE

An example through which the effect of the position correction method according to the present embodiment was confirmed will be described. In the example, first, the contact position was corrected using a jig probe card having probes arranged as shown in FIG. 4, described above. Subsequently, electrode pads of a product wafer were brought into contact with respective probes of the inspection probe card. About 3,000 needle traces were formed on the respective electrode pads of the product wafer. Deviation amounts between the gravity center positions of the needle traces and the respective center positions of the electrode pads were measured. In addition, in the example, the control device 300 analyzed an image of each of the needle traces picked up by the upper camera 241 and calculated a gravity central position of each of the needle traces.

In a comparative example, first, the contact position was corrected using a jig probe card having probes arranged as shown in FIG. 6A. Subsequently, by a method analogous to that of the above example, electrode pads of a product wafer were brought into contact with respective probes of the inspection probe card. About 3,000 needle traces were formed on the respective electrode pads of the product wafer. Deviation amounts between gravity central positions of the needle traces and center positions of the respective electrode pads were measured. In addition, in the comparative example, an operator identified gravity central positions of needle traces by checking images of the needle traces, which are picked up at several places by the upper camera 241, using a monitor.

FIGS. 9A and 9B are views each showing deviation amounts between gravity central positions of needle traces and a center position of an electrode pad. FIGS. 9A and 9B show the results of an example and a comparative example, respectively. In FIGS. 9A and 9B, the horizontal axis indicates a deviation amount ($\mu$m) in the X direction and the vertical axis indicates a deviation amount ($\mu$m) in the Y direction.

As shown in FIG. 9A, in the example, the median value of the deviation amounts in the X direction was +1.3 $\mu$m, and the median value of the deviation amounts in the Y direction was −1.0 $\mu$m. Thus, it was confirmed that the median values of the deviation amounts in the X direction and the Y direction are close to zero.

Meanwhile, as shown in FIG. 9B, in the comparative example, the median value of the deviation amounts in the X direction was −9.8 $\mu$m, the median value of the deviation amounts in the Y direction was +7.2 $\mu$m. Thus, it was confirmed that the median values of the deviation amounts in the X direction and the Y direction are far from zero.

From the above results, it is considered that it is possible to correct the contact position with high accuracy using the position correction method according to the present embodiment.

In the above embodiment, the regions A, B, C, and D are examples of a first region, a second region, a third region, and a fourth region, respectively. In addition, the wafer W is an example of an object to be inspected, and the upper camera 241 is an example of an imaging part.

According to the present disclosure in some embodiments, it is possible to correct a contact position with high accuracy.

Although the embodiments for carrying out the present disclosure have been described above, the above contents do not limit the contents of the present disclosure, and various modifications and improvements are possible within the scope of the present disclosure.

What is claimed is:

1. A position correction method for correcting a relative position between a probe card having a plurality of cantilever-type probes and an object to be inspected having a plurality of electrode pads, the method comprising:
    arranging a first group of cantilever-type probes among the plurality of cantilever-type probes in a first region and a second region which face each other across a center of the probe card, respectively, wherein a longitudinal direction of the first group of cantilever-type probes corresponds to a first direction passing through the first region, the center of the probe card, and the second region;
    arranging a second group of cantilever-type probes among the plurality of cantilever-type probes in a third region and a fourth region which face each other across the center of the probe card, respectively, wherein a longitudinal direction of the second group of cantilever-type probes corresponds to a second direction perpendicular to the first direction;
    obtaining needle traces formed on the plurality of electrode pads, which are generated when the first group of cantilever-type probes and the second group of cantilever-type probes that are arranged in the first region, the second region, the third region, and the fourth region, are brought into contact with the plurality of electrode pads; and
    correcting the relative position between the probe card and the object to be inspected based on the obtained needle traces,
    wherein the first group of cantilever-type probes arranged in the first region has a first scrubbing direction associated therewith and the first group of cantilever-type probes arranged in the second region also has the first scrubbing direction associated therewith,
    wherein the second group of cantilever-type probes arranged in the third region has a second scrubbing direction associated therewith and the second group of cantilever-type probes arranged in the fourth region also has the second scrubbing direction associated therewith, and
    wherein the second scrubbing direction is perpendicular to the first scrubbing direction.

2. The position correction method of claim 1, wherein the step of correcting the relative position between the probe card and the object to be inspected includes:
    picking up images of the needle traces by an imaging part;
    calculating gravity central positions of the needle traces from the picked-up images; and
    correcting the relative position based on the calculated gravity central positions.

3. The position correction method of claim 1, wherein the plurality of cantilever-type probes respectively arranged in the first region, the second region, the third region and the fourth region are different from each other in a scrubbing direction.

4. The position correction method of claim 1, wherein the probe card is a jig probe card having a plurality of probes for position correction provided thereon, and
    a correction result obtained by the position correction method is used as an offset value when an inspection probe card for product inspection is used.

5. An inspection apparatus for inspecting an electrical characteristic of an object to be inspected by bringing a plurality of cantilever-type probes into contact with a plurality of electrode pads of the object to be inspected, the inspection apparatus comprising:
- a probe card on which the plurality of cantilever-type probes is arranged; and
- a controller configured to correct a relative position between the probe card and the object to be inspected,
- wherein a first group of cantilever-type probes among the plurality of cantilever-type probes is arranged in a first region and a second region which face each other across a center of the probe card, respectively, a longitudinal direction of the first group of cantilever-type probes corresponding to a first direction passing through the first region, the center of the probe card, and the second region, and a second group of cantilever-type probes among the plurality of cantilever-type probes is arranged in a third region and a fourth region which face each other across the center of the probe card, respectively, a longitudinal direction of the second group of cantilever-type probes corresponding to a second direction perpendicular to the first direction;
- wherein the controller is configured to obtain needle traces formed on the plurality of electrode pads, which are generated when the first group of cantilever-type probes and the second group of cantilever-type probes that are arranged in the first region, the second region, the third region, and the fourth region, are brought into contact with the plurality of electrode pads; and to correct the relative position between the probe card and the object to be inspected based on the obtained needle traces,
- wherein the first group of cantilever-type probes arranged in the first region has a first scrubbing direction associated therewith and the first group of cantilever-type probes arranged in the second region also has the first scrubbing direction associated therewith,
- wherein the second group of cantilever-type probes arranged in the third region has a second scrubbing direction associated therewith and the second group of cantilever-type probes arranged in the fourth region also has the second scrubbing direction associated therewith, and
- wherein the second scrubbing direction is perpendicular to the first scrubbing direction.

6. A probe card used in an inspection apparatus for inspecting an electrical characteristic of an object to be inspected by bringing a plurality of cantilever-type probes into contact with a plurality of electrode pads of the object to be inspected, the probe card comprising:
- the plurality of cantilever-type probes,
- wherein the plurality of cantilever-type probes includes:
  - a first group of cantilever-type probes arranged in a first region and a second region which face each other across a center of the probe card, respectively, wherein a longitudinal direction of the first group of cantilever-type probes corresponds to a first direction passing through the first region, the center of the probe card, and the second region; and
  - a second group of cantilever-type probes arranged in a third region and a fourth region which face each other across the center of the probe card, respectively, wherein a longitudinal direction of the second group of cantilever-type probes corresponds to a second direction perpendicular to the first direction,
- wherein the first group of cantilever-type probes arranged in the first region has a first scrubbing direction associated therewith and the first group of cantilever-type probes arranged in the second region also has the first scrubbing direction associated therewith, and
- wherein the second group of cantilever-type probes arranged in the third region has a second scrubbing direction associated therewith and the second group of cantilever-type probes arranged in the fourth region also has the second scrubbing direction associated therewith,
- wherein the second scrubbing direction is perpendicular to the first scrubbing direction.

\* \* \* \* \*